United States Patent [19]
Sato et al.

[11] 4,397,928
[45] Aug. 9, 1983

[54] PROCESS OF PRODUCING COLOR SOLID IMAGE PICKUP ELEMENT BASE PLATES

[75] Inventors: Masamichi Sato; Eiichi Hasegawa; Koji Shimanuki, all of Asaka, Japan

[73] Assignee: Fuji Photo Film Co., Ltd., Kanagawa, Japan

[21] Appl. No.: 399,080

[22] Filed: Jul. 16, 1982

[30] Foreign Application Priority Data

Jul. 16, 1981 [JP] Japan ................ 56-111368

[51] Int. Cl.$^3$ .............................. G03F 5/00
[52] U.S. Cl. ..................... 430/7; 430/321; 430/364; 430/365
[58] Field of Search ............. 430/7, 321, 364, 365

[56] References Cited

U.S. PATENT DOCUMENTS

| | | | |
|---|---|---|---|
| 3,271,345 | 9/1966 | Nadeau et al. | 430/225 |
| 4,081,277 | 3/1978 | Brault et al. | 430/200 |
| 4,169,009 | 4/1980 | Martin et al. | 430/321 |
| 4,271,246 | 6/1981 | Sato et al. | 430/7 |
| 4,342,818 | 8/1982 | Yokota et al. | 430/7 |
| 4,345,021 | 8/1982 | Ogawa et al. | 430/321 |

Primary Examiner—J. Travis Brown
Attorney, Agent, or Firm—Sughrue, Mion, Zinn, Macpeak and Seas

[57] ABSTRACT

A multicolor solid image pickup element base plate having bonding pat portions is produced by an on-wafer method utilizing a silver halide photographic emulsion. A solvent permeation preventing layer is formed on a solid image pickup element base plate having an array of a number of image elements. A silver halide emulsion layer is formed on that layer. A micro color filter composed of two or more color separation filter elements is then formed on the emulsion layer. The filter is formed by repeatedly applying a pattern exposure and color development onto the emulsion layer. A protective layer is formed over the entire surface of the base plate. The protective layer, silver halide emulsion layer, and solvent permeation preventing layer are then successively removed. Blackened silver portions may be formed in the emulsion layer at portions corresponding to bonding pat portions prior to the formation of the protective layer by applying thereto a pattern exposure followed by black and white development.

4 Claims, 10 Drawing Figures

PROCESS OF PRODUCING COLOR SOLID IMAGE PICKUP ELEMENT BASE PLATES

CROSS REFERENCES

This application is related to our U.S. application Ser. No. 399,090 entitled "Process of Producing Color Solid Image Pickup Element Base Plates." The related application was filed concurrently with this application in U.S. and is based on Japanese patent application No. 111367/81. The disclosure contained within our related application is hereby incorporated by reference within this application.

FIELD OF THE INVENTION

This invention relates to a process of producing a color solid image pickup element base plate, and more particularly to a process of producing a color solid image pickup element base plate by directly forming a micro color filter on a solid image pickup element base plate.

BACKGROUND OF THE INVENTION

A single plate-type or two plate-type color solid pickup element (or color solid imaging element) has laminated on the surface thereon micro color filters composed of multicolor separation filter elements of red, green, and blue or of cyan, magenta, and yellow corresponding to each image element constituting the image pickup element. The production process for such a solid image pickup element is generally classified into a lamination process and an on-wafer process. The on-wafer process is described in, for example, U.S. Pat. Nos. 4,081,277, 3,271,345 and 3,707,373.

In the former process, a color solid image pickup element is prepared by separately forming a solid image pickup element base plate and a micro multicolor filter plate having disposed on a transparent support color separation filter elements corresponding to each image element of the solid image pickup element. The plates are then bonded to each other. On the other hand, in the latter process, a micro multicolor filter is formed directly on a solid image pickup element base plate.

Accordingly, the former process requires precise registration of each color separation filter element and each image element of a solid image pickup element before bonding the two plates. However, by using the latter process, it is possible to employ the process of forming the micro multicolor filter as a part of a semiconductor production process. Therefore, the latter process is said to be an inevitable technique for producing color solid image pickup elements at low cost.

In addition, as the latter process, there are a process of forming on a wafer having formed therein a number of regularly disposed solid image pickup elements color separation filter elements each corresponding to each image element of said solid image pickup elements to simultaneously form a number of color solid image pickup elements and a process (on-chip process) of forming a color separation filter element on a single solid image pickup element (chip) cut from the foregoing wafer having a large number of solid image pickup elements. These processes are all called "on-wafer process" in this specification.

SUMMARY OF THE INVENTION

An object of this invention is, therefore, to provide a novel process of producing a color solid image pickup element base plate by an on-wafer process.

Another object of this invention is to provide a process of producing a color solid image pickup element base plate by an on-wafer process capable of producing color solid image pickup elements easily and at low cost by using a silver halide photographic technique.

According to the present invention, there is provided a process of producing a color solid image pickup element base plate comprising the steps of;

coating a solvent permeation preventing layer formed on the surface of a solid image pickup element base plate with a silver halide emulsion layer;

forming a micro color filter composed of at least two-color color separation filter elements by repeatedly applying an image exposure and a color development to the silver halide emulsion layer for each color;

forming a protective layer on the whole surface of the solid image pickup element base plate having the micro color filter thus formed thereon; and removing the protective layer, the silver halide emulsion layer, and the solvent permeation preventing layer in this order at at least the portions corresponding to bonding pat portions of the solid image pickup element base plate having the protective layer thus formed to reveal the bonding pat portions.

DESCRIPTION OF THE PREFERRED EMBODIMENT

The invention will be described below in more detail by referring to the accompanying drawings. However, the scope of the present invention is in no way limited by the drawings or the specific embodiments they represent.

Figure 1:
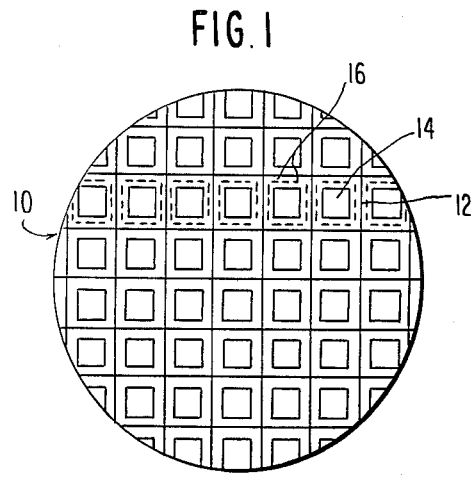
FIG. 1 is a plan view of a solid image pickup element base plate used in the process of this invention.
Figure 2:
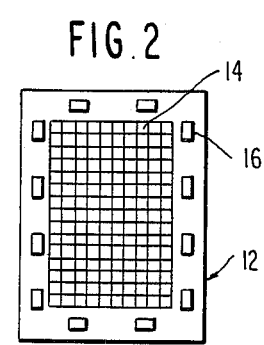
FIG. 2 is an enlarged plan view of one elemental base plate of the solid image pickup element base plate shown in FIG. 1.
Figure 3:
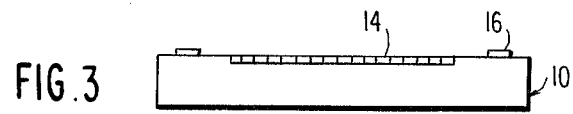
FIG. 3 is a schematic cross-sectional view of the elemental base plate shown in FIG. 2, and FIG. 4 to FIG. 10 are cross-sectional views showing the steps of forming a color solid image pickup element base plate by the process of this invention.

FIG. 1 shows a wafer-type solid image pickup element base plate used in this invention. The numeral 10 shows a solid image pickup element base plate having a large number of regularly arrayed solid image pickup elements 12 formed on a silicon wafer by an ordinary wafer process. As shown in FIG. 2 and FIG. 3, each solid image pickup element 12 has an image-receiving portion 14 having an array of image elements and a bonding pat portion 16 for connecting a leading wire.

FIG. 4 to FIG. 10 are schematic cross-sectional views showing the steps of producing a color solid image pickup element base plate by forming a micro color filter on the wafer-type solid image pickup element base plate 10 as shown in FIG. 1 and for simplifying the explanation of the production steps, the steps are described in these figures by referring to one solid image pickup element 12.

Figure 4:
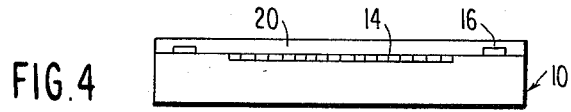

FIG. 4 is a schematic cross-sectional view showing the plate 10 after a solvent permeation preventing layer 20 is formed on the surface of the plate 10 shown in FIG. 3. The solvent permeation preventing layer 20 is a layer for preventing each processing solution (mainly, an aqueous solution) used from contacting the plate 10. The processing solution is for removing a silver halide emulsion layer and forming a micro color filter in the silver halide emulsion layer as will be described later. Such a solvent permeating preventing layer is formed by a material which can prevent the permeation of the foregoing solvent or solution without producing bad electrochemical influences on the surface of the solid image pickup element base plate 10.

The material for forming the solvent permeation preventing layer 20 is selected from, for example, inorganic materials such as silicon nitride, silicon carbide, silicon oxide and phosphosilicate glass. The layer 20 may be formed by a chemical vapor deposition method, a plasma chemical vapor deposition method, or a sputtering method. In particular, silicon nitride and phosphosilicate glass are preferably provided by the plasma chemical vapor deposition method and the chemical vapor deposition method, respectively. Other useful materials for forming the layer 20 include various photoresists such as KPR and KTFR (trade names of Eastman Kodak, Co.), TPR and OMR-83 (trade names, made by Tokyo Ooka Kogyo K.K.), AZ-1350 (trade name, made by Shipley Company), etc.; various electron beam resists such as polymethyl methacrylate, polyglycidyl methacrylate, etc.; and various polymers such as cellulose acetate, soluble polyester, polyamide, polyvinyl chloride, polyvinyl acetate, vinyl chloride-vinyl acetate copolymer, polyisoprene, styrene-butadiene latex, polyvinyl alcohol, polymethyl methacrylate, polyvinyl butyral, polyparaxylylene, etc. Of these materials, silicon nitride, phosphosilicate glass and photoresist KPR are preferred.

Figure 5:
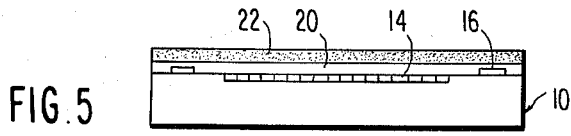

A silver halide photographic emulsion layer 22 is then formed on the surface of the solvent permeation preventing layer 20 which is formed on the plate 10 as shown in FIG. 5.

The silver halide emulsion used in this invention may be prepared by dispersing a silver halide in an aqueous solution of a water-soluble binder by a conventional manner. In this invention, fine grain silver halide emulsions are particularly preferred. An example of a particularly preferred emulsion is a so-called Lippmann emulsion in which the mean grain size of the silver halide is not more than about 0.1 $\mu$m. The weight ratio of silver halide to the water-soluble binder is in a range of from about 1:6 to about 8:1. In general, any silver halide can be used in this invention with suitable examples being silver chloride, silver bromide, silver iodide, silver chlorobromide, silver iodobromide, silver chloroiodide, silver chloroiodobromide, etc. Examples of the water-soluble binder used in this invention are gelatin, albumin, casein, cellulose derivatives, agar, sodium alginate, sugar derivatives, polyvinyl alcohol, polyvinylpyrrolidone, polyacrylamide, etc. If necessary, a mixture of at least two miscible binders illustrated above may be used. The dry thickness of the silver halide emulsion layer 22 is preferably about 0.8 $\mu$m to about 10 $\mu$m. If necessary, a subbing layer may be formed between the silver halide emulsion layer 22 and the solvent permeation preventing layer 20 in order to make the coating of the silver halide emulsion layer 22 uniform. In order to coat the silver halide emulsion layer 22, a spin coating method which is usually employed in a process of coating a photoresist on the surface of a semiconductor wafer can be used.

Figure 6:
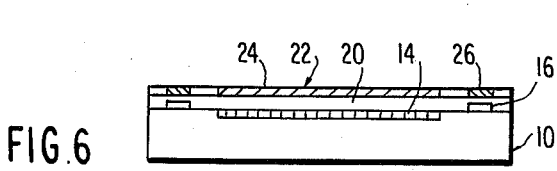

A micro color filter 24 is then formed on the silver halide emulsion layer 22. The micro color filter 24 is comprised of color separation filter elements of, e.g., red, green, and blue or of cyan, magenta, and yellow corresponding to each image element of the light-receiving portion 14 of the plate 10 as shown in FIG. 6.

The micro color filter 24 is formed by forming at least two-color, color separation filter elements, by applying a color photographic development process for each color. The process of using color coupler-containing developers was previously proposed in U.S. Pat. No. 4,271,246 herein incorporated by reference and the process of using developers containing dye developers was described in U.S. patent application filed Dec. 22, 1980, now U.S. Pat. No. 4,342,818 herein incorporated by reference.

When utilizing the former process, at least one black and white silver halide emulsion layer 22 is exposed to light through a pattern of a first color (e.g., cyan) corresponding to the specific image elements of the light-receiving portion 14. A pattern containing a dye of the first color (cyan) is then formed by development with a developer containing the color coupler. Preferably, after removing silver contained in the foregoing pattern by bleaching or rehalogenating the silver, the unexposed silver halide emulsion layer containing silver halide is then exposed to light through a pattern of a second color (e.g., magenta). The exposure is made at the portions corresponding to different image elements than the foregoing image elements. A pattern containing a dye of the second color (magenta) is then formed by development with a developer containing the color coupler. If necessary, after bleaching or rehalogenating silver in the second color pattern as described above, a pattern containing a dye of a third color (e.g., yellow) may be formed. This pattern is formed by a similar step to the step described above. Accordingly, at least two-color patterns and perhaps three-color patterns are formed. After the final color development, a silver removing procedure is performed. This involves removing any silver grains remaining in the patterns by bleaching. In addition, any remaining silver halide is removed by fixing. Accordingly, a micro color filter is formed.

When using the latter process, at least one silver halide emulsion layer is exposed to light through a pattern for a first color by the manner as described above. The exposed layer is then developed with a developer containing a dye developer of the first color to form a pattern containing the dye of the first color. Preferably, after removing silver contained in the pattern by bleaching or rehalogenating the silver, at least two-color patterns are formed by repeating at least once the foregoing step of performing a pattern exposure for a second color and developing with a developer containing the dye developer for the second color. Thereafter, by performing a silver removing procedure, a micro color filter is formed.

Furthermore, a combination of the foregoing two processes can be used for forming a micro color filter in this invention.

In addition, in the foregoing two processes, by applying a light exposure and a black and white development to at least the portions corresponding to the bonding pat portions prior to performing the silver removing procedure (i.e., fixing procedure) after forming dye patterns corresponding to image elements by performing a pattern exposure, a color development, and bleach for each color, blackened silver patterns 26 are formed at the portions. At the portions, the silver halide emulsion layer is removed by an etch-bleaching step as will be described later. Also, simultaneously with the formation of blackened silver at the portions, spaces between the dye patterns can be blackened as described in Japanese patent application (OPI) No. 75606/81. Thus, the occurrence of diffused reflection of light at the spaces between image elements, such as the portions of transfer electrodes of interline CCD can be prevented and the S/N ratio of the light-receiving signal of the color solid image pickup element thus obtained can be further increased.

The light source used to form a micro color filter in this invention may be a light source emitting light of wave lengths sensitive to the particular silver halide emulsion layer used. For example, it is possible to use a light source which emits white light.

Conventional color coupler-containing developers and dye developers may be used in the foregoing process. Furthermore, conventional bleach solutions and fix solutions may be used in this invention. Such conventional solutions are described in detail in the foregoing U.S. Pat. No. 4,271,246 and U.S. Pat. No. 4,342,818.

Conventional developing agents can be used for forming the blackened silver patterns 26 in this invention. Examples of such agents include hydroquinone, pyrogallol, 1-phenyl-3-pyrazolidone, p-aminophenol, ascorbic acid.

Figure 7:
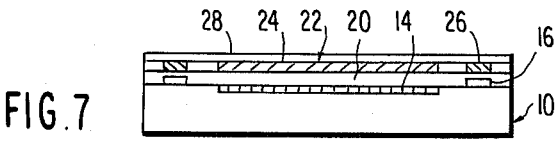

As shown in FIG. 7, a protective layer 28 is then formed over the whole surface of the solid image pickup element base plate 10 having formed thereon the micro color filter 24 and the blackened silver pattern 26. The protective layer 28 is mainly used for increasing the mechanical strength of the surface of the micro color filter 24. Therefore, the protective layer 28 may be composed of a material having a high mechanical strength as compared with that of the silver halide emulsion layer. Furthermore, the material should have good transparency. The material for the protective layer may be selected from inorganic materials such as glass, or organic materials such as various polymers. However, in view of the step of removing the silver halide emulsion layer 22 and the solvent permeation preventing layer 20 at the portions corresponding to the bonding pat portions as will be described below, it is preferable to use various photoresists (photopolymers) to form the protective layer 28.

Figure 8:
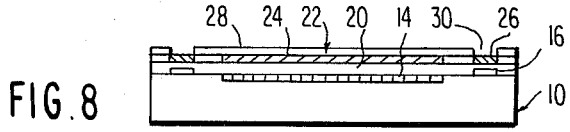

The protective layer 28 formed on the plate 10 is then removed at the portions corresponding to the bonding pat portions to reveal the silver halide emulsion layer 22 at the portions as shown in FIG. 8. A numeral 30 shows the open portion of the protective layer 28. When the protective layer 28 is composed of, for example, a photoresist, the portions corresponding to the bonding pat portions 16 may be removed or uncovered by applying light exposure and development to the photoresist layer at those portions. When the protective layer 28 is composed of material other than photoresist, the removal of the protective layer 28 at the bonding pat portions may be performed by applying a photoresist layer on the protective layer 28, applying light exposure and development to the portions of the photoresist layer to uncover the portions corresponding to the bonding pat portions 16. The protective layer 28 is then removed at the open portions.

Figure 9:
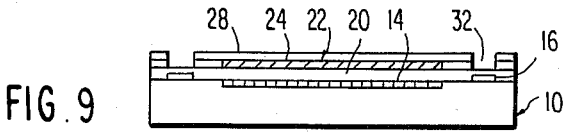

After the protective layer 28 is removed at portions 30 corresponded to the bonding pat portions 16 to reveal the silver halide emulsion layer 22 at those portions, the silver halide emulsion layer 22 is removed at the portions corresponding to the bonding pat portions as shown in FIG. 9. A numeral 32 shows the portion where the silver halide emulsion layer 22 has been removed. The partial removal of the silver halide emulsion layer 22 is performed by etch-bleaching the blackened silver 26 formed at the portions corresponding to the bonding pat portions 16 through the openings 30 with the protective layer as the resist.

Etch-bleaching is a phenomenon wherein a silver halide emulsion layer having a silver image is processed by an etching bleaching solution, and the silver image portion of the silver halide emulsion layer is removed.

Conventional etch-bleaching solutions can be used in this invention. Examples are described in *TAGA Proceedings*, pp. 1–11 (1967) and *PSA Technical Quarterly*, Nov., pp. 130–134 (1955). Practical examples of the etch-bleaching solution include an aqueous solution containing cupric chloride, citric acid, and hydrogen peroxide; an aqueous solution containing copper nitrate, potassium bromide, lactic acid, and hydrogen peroxide; an aqueous solution containing ferric nitrate, potassium bromide, lactic acid, and hydrogen peroxide; an aqueous solution containing ferric nitrate, potassium bromide, and lactic acid; and an aqueous solution containing stannic chloride and potassium bromide.

In the above-described process, the removal of the silver halide emulsion layer 22 at the portions corresponding to the bonding pat portions shown in FIG. 9 is performed by etch-bleaching the blackened silver portions 26 formed in the silver halide emulsion layer 22 at the portions corresponding to the bonding pat portions 16 as shown in FIG. 6. However, the removal of the silver halide emulsion layer is not limited to the foregoing process. For example, the silver halide emulsion layer may be washed off at those portions with warm water or an alkaline aqueous solution with the protective layer 28 as a resist. Furthermore, the silver halide emulsion layer may be immersed in water containing a gelatin decomposing enzyme to decompose the gelatin in the emulsion layer. In these cases, the step of forming blackened silver 26 as shown in FIG. 6 is not indispensable.

Furthermore, when using the wafer-type solid image pickup element base plate as shown in FIG. 1, it is preferable to remove the silver halide emulsion layer at the portions corresponding to dicing portions simultaneously with the removal of the silver halide emulsion layer at the portions corresponding to at least the bonding pat portions. Dicing is a process of cutting each chip from a multichip wafer. Dicing is usually performed while supplying cooling water to the cutting portion to cool the heat generated during dicing. Further washing with an organic solvent such as trichlene, acetone, etc. is performed after dicing. Therefore, if the silver halide emulsion exists at the cut portions, the emulsion layer at the cut portions will be swollen which will cause peeling of the emulsion layer. The peeling of the emulsion layer at such portions does not directly influence the formation of the micro color filter of this invention if the emulsion layer carrying a micro color filter formed thereon is not peeled. However, the fine emulsion pieces which are peeled may attach to the surface of the micro color filter formed and reduce the yield of the color solid image pickup elements. Consequently, by previously removing the silver halide emulsion layer at the portions corresponding to such dicing portions, the foregoing fault can be eliminated.

Figure 10:
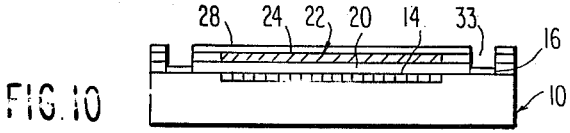

In accordance with this invention, the solid image pickup element base plate 10 has a protective layer and silver halide emulsion layer which layers are removed at the portions corresponding to the bonding pat portions 16. Further, the solvent permeation preventing layer 20 is removed at the portions as shown in FIG. 10 to reveal the bonding pat portions 16. Accordingly, a color solid image pickup element base plate is obtained. When the solvent permeation preventing layer 20 is composed of, for example, a glass such as phosphosilicate glass, the layer can be removed with a solvent such as ammonium fluoride. Alternatively, it may be removed by dry etching using a plasma containing a gas such as freon-12 ($CCl_2F_2$). Furthermore, when the solvent permeation preventing layer 20 is composed of a polymer, the polymer layer can be removed with a solvent for the polymer. Still further, when the solvent permeation preventing layer 20 is composed of a photopolymer, etc., the photopolymer layer may be selectively exposed to light in order to improve the solubility or removability of the portions corresponding to the bonding pat portions 16 prior to the application of a silver halide emulsion on the solvent permeation preventing layer 20.

When a number of color solid image pickup elements are simultaneously formed on one wafer, each color solid image pickup element is obtained by cutting each element from the wafer.

As described above, according to this invention, color solid image pickup elements can be easily obtained at low cost by an on-wafer method by using a silver halide photographic technique.

While the invention has been described in detail and with reference to specific embodiment thereof, it will be apparent to one skilled in the art that various changes and modifications can be made therein without departing from the spirit and scope thereof.

What is claimed is:

1. A process of producing a color solid image pickup element base plate comprising the steps of;
    coating a solvent permeation preventing layer formed on the surface of a solid image pickup element base plate with a silver halide emulsion layer,
    forming a micro color filter composed of at least two-color color separation filter elements by repeatedly applying an image exposure and a color development to the silver halide emulsion layer for each color,
    forming a protective layer on the whole surface of the solid image pickup element base plate having the micro color filter thus formed thereon, and
    removing the protective layer, the silver halide emulsion layer, and the solvent permeation preventing layer in this order at least the portions corresponding to bonding pat portions of the solid image pickup element base plate having the protective layer thus formed to reveal the bonding pat portions.

2. The process of producing a color solid image pickup element base plate as claimed in claim 1 wherein a blackened silver pattern is formed in the silver halide emulsion layer at the portions corresponding to the bonding pat portions by applying a light exposure and a black and white development to the portions after the formation of the micro color filter and before the formation of the protective layer.

3. The process of producing a color solid image pickup element base plate as claimed in claim 1, wherein the silver halide emulsion layer has a thickness from about 0.8 μm to about 10 μm.

4. The process of producing a color solid image pickup element base plate as claimed in claim 1, wherein a subbing layer is positioned between the silver halide emulsion layer and the solvent permeation preventing layer.

* * * * *